United States Patent
Wang et al.

(10) Patent No.: US 10,177,060 B2
(45) Date of Patent: Jan. 8, 2019

(54) CHIP PACKAGE STRUCTURE AND MANUFACTURING METHOD THEREOF

(71) Applicant: Powertech Technology Inc., Hsinchu County (TW)

(72) Inventors: Chi-An Wang, Hsinchu County (TW); Hung-Hsin Hsu, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 15/644,839

(22) Filed: Jul. 10, 2017

(65) Prior Publication Data

US 2018/0114736 A1  Apr. 26, 2018

Related U.S. Application Data

(60) Provisional application No. 62/410,853, filed on Oct. 21, 2016.

(51) Int. Cl.
*H01L 23/31* (2006.01)
*H01L 21/288* (2006.01)
(Continued)

(52) U.S. Cl.
CPC ...... *H01L 23/3128* (2013.01); *H01L 21/2885* (2013.01); *H01L 21/4803* (2013.01); *H01L 21/4817* (2013.01); *H01L 21/4846* (2013.01); *H01L 21/4853* (2013.01); *H01L 21/56* (2013.01); *H01L 21/565* (2013.01); *H01L 23/12* (2013.01); *H01L 23/16* (2013.01);
(Continued)

(58) Field of Classification Search
CPC ............ H01L 23/3114; H01L 23/3128; H01L 23/49816; H01L 23/49827; H01L 23/49838
See application file for complete search history.

(56) References Cited

U.S. PATENT DOCUMENTS

| | | |
|---|---|---|
| 7,906,857 B1 | 3/2011 | Hoang et al. |
| 2005/0056928 A1 | 3/2005 | Kwon et al. |

(Continued)

FOREIGN PATENT DOCUMENTS

TW     201616618     5/2016

OTHER PUBLICATIONS

"Office Action of Taiwan Counterpart Application", dated Aug. 31, 2018, p. 1-p. 4.

*Primary Examiner* — Cuong Q Nguyen
(74) *Attorney, Agent, or Firm* — JCIPRNET (57) ABSTRACT

A chip package structure includes a substrate, a chip, an encapsulant, a plurality of solder balls and a patterned metal layer. The substrate includes a first surface and a second surface opposite to each other. The chip is disposed on the first surface and electrically connected to the substrate. The encapsulant encapsulates the chip and covering the first surface. The solder balls are disposed on the second surface and electrically connected to the substrate. The patterned metal layer s disposed on the encapsulant. The patterned metal layer includes at least one concave portion and at least one convex portion defined by the concave portion. The convex portion faces the encapsulant. The adhesion layer is disposed between the patterned metal layer and the encapsulant. The adhesion layer is filled in the concave portion.

19 Claims, 5 Drawing Sheets

(51) Int. Cl.
*H01L 21/48* (2006.01)
*H01L 21/56* (2006.01)
*H01L 23/498* (2006.01)
*H01L 23/12* (2006.01)
*H01L 23/488* (2006.01)
*H01L 23/16* (2006.01)
*H01L 23/00* (2006.01)

(52) U.S. Cl.
CPC ...... *H01L 23/3114* (2013.01); *H01L 23/3142* (2013.01); *H01L 23/488* (2013.01); *H01L 23/49816* (2013.01); *H01L 23/49827* (2013.01); *H01L 23/49838* (2013.01); *H01L 23/562* (2013.01); *H01L 24/26* (2013.01); *H01L 21/568* (2013.01); *H01L 24/16* (2013.01); *H01L 24/32* (2013.01); *H01L 24/48* (2013.01); *H01L 24/73* (2013.01); *H01L 24/81* (2013.01); *H01L 24/83* (2013.01); *H01L 24/85* (2013.01); *H01L 24/92* (2013.01); *H01L 2224/16227* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2924/182* (2013.01); *H01L 2924/3511* (2013.01)

(56) References Cited

U.S. PATENT DOCUMENTS

| | | |
|---|---|---|
| 2006/0118969 A1* | 6/2006 | Yuan ................. H01L 23/36 257/778 |
| 2009/0186446 A1 | 7/2009 | Kwon et al. |
| 2010/0096747 A1 | 4/2010 | Kusano |
| 2014/0167243 A1 | 6/2014 | Shen |
| 2015/0357258 A1* | 12/2015 | Fitzgerald .......... H01L 23/3675 257/713 |
| 2016/0126228 A1 | 5/2016 | Hsieh et al. |
| 2016/0300774 A1 | 10/2016 | Kim et al. |

* cited by examiner

CHIP PACKAGE STRUCTURE AND MANUFACTURING METHOD THEREOF

CROSS REFERENCE TO RELATED APPLICATION

This application claims the priority benefit of U.S. provisional application Ser. No. 62/410,853, filed on Oct. 21, 2016. The entirety of the above-mentioned patent application is hereby incorporated by reference herein and made a part of specification.

BACKGROUND OF THE INVENTION

Field of the Invention

The present disclosure generally relates to a package structure and a manufacturing method thereof. More particularly, the present disclosure relates to a chip package structure and a manufacturing method thereof.

Description of Related Art

Modern electronic devices require small size, large memory capacity and high performance for their applications such as mobile applications. Consequently, semiconductor chip packages that go into modern electronic devices, such as mobile electronic devices, also have to have small size, large memory capacity, and high performance.

Typically, a printed circuit board (PCB) includes an insulating substrate, which is typically made of a polyimide material, and a conductive pattern, which is typically made of copper (Cu). The conductive pattern may be disposed in between layers of the substrate or it may be disposed on one of the substrate surfaces. When a chip package is used in an electronic system, such as the main board in a mobile electronic device, the package may be subjected to a high thermal process for bonding purposes. The high thermal process used to either form solder balls or join the chip package to the circuit board may cause warpage of the chip package due to the coefficient of thermal expansion (CTE) mismatch between the various components in the chip package. This warpage may lead to open connection failures between the chip package and the circuit board. Such warpage also causes non-uniform height of the solder balls against the main board during mounting, thereby causing contact failures.

SUMMARY OF THE INVENTION

Accordingly, the present disclosure is directed to a chip package structure and a manufacturing method thereof, wherein warpage of the chip package structure is reduced and the reliability of the chip package structure is enhanced.

The present disclosure provides a chip package structure including a substrate, a chip, an encapsulant, a plurality of solder balls and a patterned metal layer. The substrate includes a first surface and a second surface opposite to each other. The chip is disposed on the first surface and electrically connected to the substrate. The encapsulant encapsulates the chip and covering the first surface. The solder balls are disposed on the second surface and electrically connected to the substrate. The patterned metal layer is disposed on the encapsulant and the patterned metal layer includes at least one convex portion bulged toward the encapsulant. The convex portion faces the encapsulant. The adhesion layer is disposed between the patterned metal layer and the encapsulant. The adhesion layer is filled in the concave portion.

The present disclosure provides a manufacturing method of a chip package structure, and the method includes the following steps. A chip is disposed on a first surface of a substrate, wherein the chip is electrically connected to the substrate. An encapsulant is formed to encapsulate the chip and cover the first surface. A plurality of solder balls are formed on a second surface of the substrate, wherein the second surface is opposite to the first surface and the solder balls are electrically connected to the substrate. A patterned metal layer is formed, wherein the patterned metal layer includes at least one convex portion bulged toward the encapsulant. The patterned metal layer is adhered to the encapsulant by an adhesion layer, wherein the convex portion faces the encapsulant and the adhesion layer is filled in the concave portion.

In light of the foregoing, in the chip package structure and the manufacturing method thereof, a chip package may be warped after the high thermal process of forming solder balls. Accordingly, in the present disclosure, a patterned metal layer including at least one convex is adhered to a chip package by an adhesion layer. The position of the convex portion of the patterned metal layer is corresponding to the warpage of the chip package so as to press the warpage downward. Therefore, the warpage of the chip package structure is improved and the reliability of the chip package structure is enhanced.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present preferred embodiments of the invention, examples of which are illustrated in the accompanying drawings.

Wherever possible, the same reference numbers are used in the drawings and the description to refer to the same or like parts.

Figure 1:
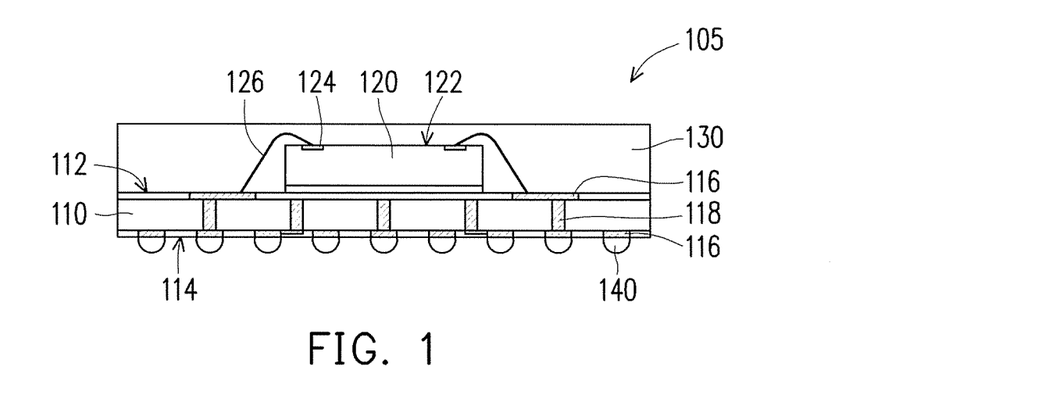
FIG. 1 illustrates a chip package according to an embodiment of the present invention.

FIG. 1 illustrates a chip package according to an embodiment of the present invention. In the present embodiment, a manufacturing method of a chip package structure includes the following steps. First, a chip package 105 as shown in FIG. 1 is provided. In the present embodiment, a chip 120 may be firstly disposed on a substrate 110. The substrate 110 includes a first surface 112, a second surface 114 opposite to the first surface 112, a plurality of patterned circuit layers 116 disposed on the first surface 112 and the second surface 114 respectively and a plurality of through vias 118 penetrating the substrate 110 and electrically connecting the patterned circuit layers 116. The chip 120 is mounted on the first surface 112 of the substrate 110 and electrically connected to the substrate 110 by wire bonding technique. In the present embodiment, the chip 120 may include an active surface 122 and a plurality pads 124 disposed on the active surface 122. The active surface 122 faces away from the substrate 110 and the pads 124 of the chip 120 may be electrically connected to the patterned circuit layers 116 through a plurality of wires 126.

Then, an encapsulant 130 is formed to encapsulate the chip 120 and the wires 126. The encapsulant 130 covers the first surface 112 of the substrate 110. Then, a plurality of solder balls 140 are formed on a second surface 114 of the substrate 110 and electrically connected to the substrate 110. At the time, the manufacturing process of chip package 105 as shown in FIG. 1 may be substantially done. In the present embodiment, the chip package 105 may be a wire-bonding Fine-pitch Ball Grid Array (WB FBGA) package, but the disclosure is not limited thereto. Some of the embodiments of the chip packages 105 are depicted in FIG. 2 and FIG. 3 for illustration.

Figure 2:
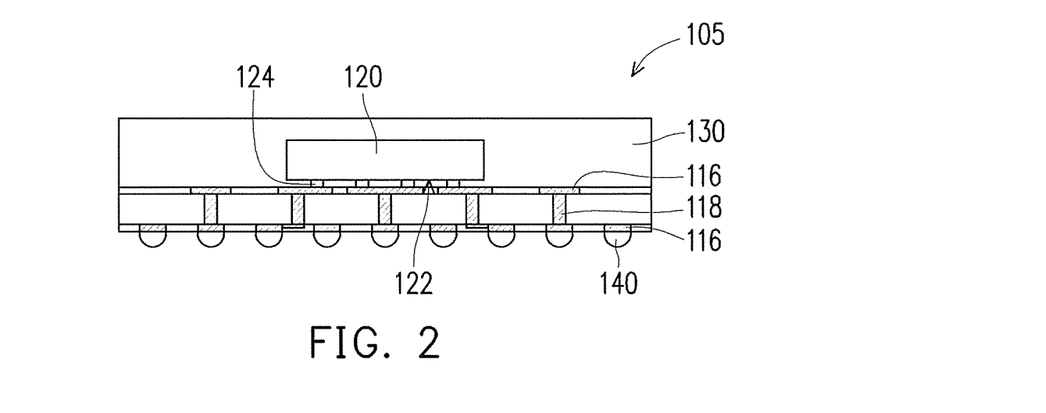
FIG. 2 illustrates a chip package according to another embodiment of the present invention.

Referring to FIG. 2, it is noted that the chip package 105 shown in FIG. 2 contains many features same as or similar to the chip package 105 disclosed earlier with FIG. 1. For purpose of clarity and simplicity, detail description of same or similar features may be omitted, and the same or similar reference numbers denote the same or like components. The main differences between the chip package 105 shown in FIG. 2 and the chip package 105 shown in FIG. 1 are described as follows. In the present embodiment, the chip 120 is mounted on the substrate 110 by a flip-chip bonding technique. In the present embodiment, the active surface 122 of the chip 120 faces the substrate 110 and the pads 124 of the chip 120 are electrically connected to the patterned circuit layers 116 of the substrate 110. Namely, the chip package 105 shown in FIG. 2 may be a Flip-Chip Chip Scale Package (FCCSP), but the disclosure is not limited thereto.

Figure 3:
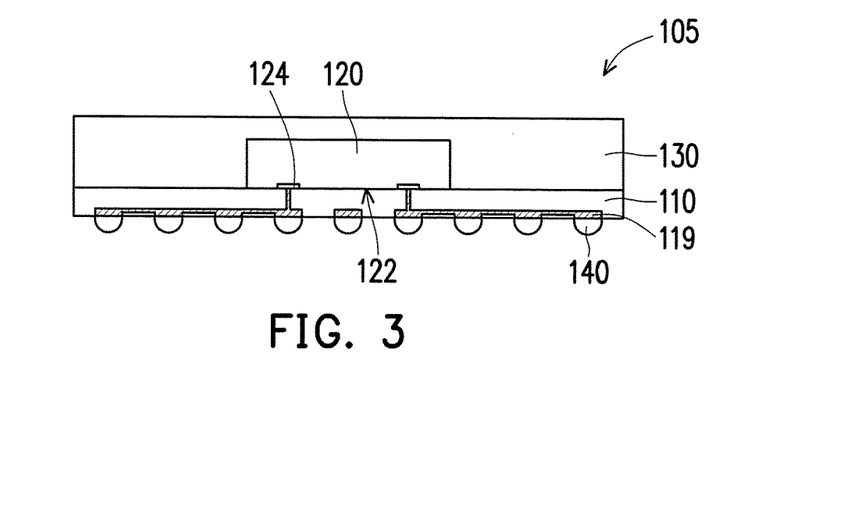
FIG. 3 illustrates a chip package according to yet another embodiment of the present invention.

Referring to FIG. 3, it is noted that the chip package 105 shown in FIG. 3 contains many features same as or similar to the chip package 105 disclosed earlier with FIG. 2. For purpose of clarity and simplicity, detail description of same or similar features may be omitted, and the same or similar reference numbers denote the same or like components. The main differences between the chip package 105 shown in FIG. 3 and the chip package 105 shown in FIG. 2 are described as follows. In the present embodiment, the substrate 110 may include a redistribution layer, and a circuit layer 119 of the redistribution layer electrically connects the chip 120 and the solder balls 140. Namely, the chip package 105 shown in FIG. 3 is a Fan-Out Wafer Level Chip Scale Package (FO WLCSP), but the disclosure is not limited thereto.

Figure 4:
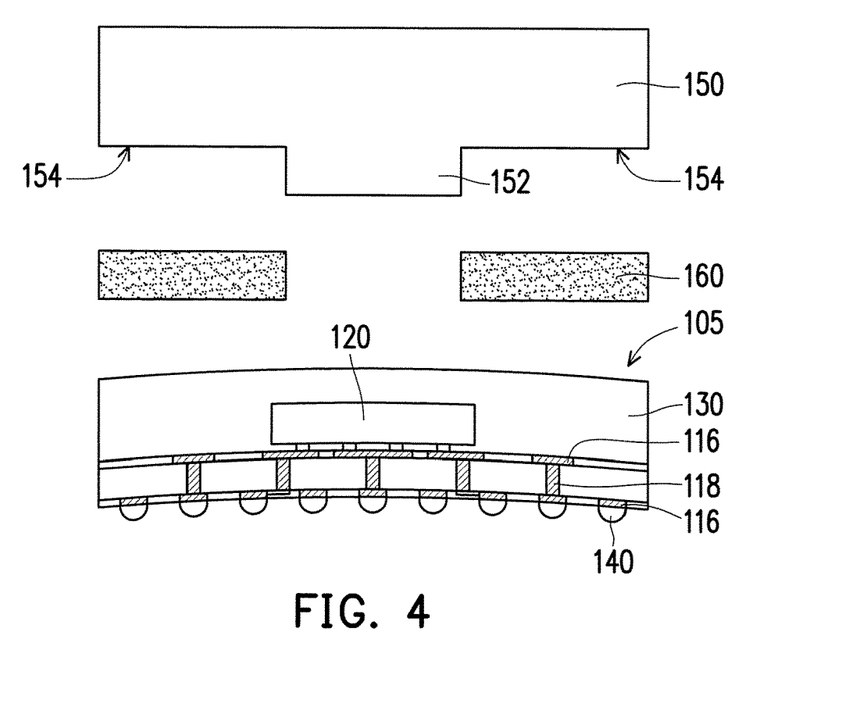
FIG. 4 to FIG. 5 illustrate a part of a manufacturing process of a chip package structure according to an embodiment of the present invention.
Figure 5:
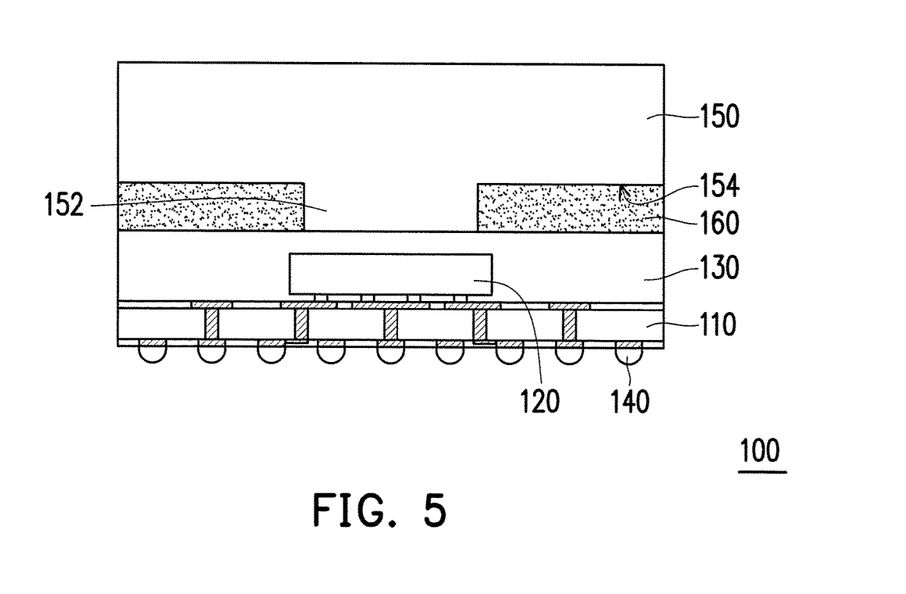

The chip package 105 of the disclosure is subjected to the high thermal process of forming solder balls 140 on the substrate 110 and/or joining the chip package 105 to a circuit board. The high thermal processes may cause warpage of the chip package 105 due to the coefficient of thermal expansion (CTE) mismatch between the various components in the chip package 105. Accordingly, a patterned metal layer 150 as shown in FIG. 4 may be formed. In the present embodiment, the patterned metal layer 150 includes at least one convex portion 152. The position of the convex portion 152 is designed according to the warpage of the chip package 105. For example, in the present embodiment, the chip package 105 may be warped at the central region, so the convex portion 152 is disposed at a central region of the patterned metal layer 150 as shown in FIG. 4. Then, the patterned metal layer 150 is adhered to the encapsulant 130 by an adhesion layer 160. The convex portion 152 may face and bulge toward the encapsulant 130. The encapsulant 130 may be pressed downward to reduce the warpage of the chip package 105. The adhesion layer 160 is filled in the gaps between the patterned metal layer 150 and the encapsulant 130 as shown in FIG. 5. At the time, the manufacturing method of the chip package structure 100 is substantially formed.

In the present embodiment, referring to FIG. 5, the patterned metal layer 150 further includes at least one concave portion 154 defined by the convex portion 152, and the adhesion layer 160 fills the gap between the concave portion 154 and the encapsulant 130. In the present embodiment, the convex portion 152 is disposed at the central region of the patterned metal layer 150 and in contact with the encapsulant 130. Accordingly, the concave portion 154 defined by the convex portion 152 surrounds the central region. As such, when the patterned metal layer 150 is adhered to the encapsulant 130 by an adhesion layer 160, the convex portion 152 is bulged toward and in contact with the encapsulant 130 to press the encapsulant 130 downward to reduce the warpage of the chip package 105. In the embodiment shown in FIG. 6, the convex portion 152 may be a curved surface. The whole surface of the patterned metal layer 150 facing the encapsulant 130 may be a curved surface bulged toward the encapsulant 130. The adhesion layer 160 is filled the gap between the patterned metal layer 150 and the encapsulant 160.

In the present embodiment, a metal layer may be firstly formed by electroplating process, and the concave portion 154 may then be formed by etching process, but the disclosure does not limit the manufacturing method of the patterned metal layer 150. Also, it is noted that the chip package 105 shown in FIG. 2 is adopted in the chip package structure 100, but the disclosure is not limited thereto. The patterned metal layer 150 may also be adhered to other types of chip packages, e.g. the chip package 105 shown in FIG. 1 and FIG. 3, to reduce the warpage thereof. In some embodiment, at least a part of the convex portion 152, e.g. the peak of the convex portion 152, may be in contact with the encapsulant 130.

Figure 6:
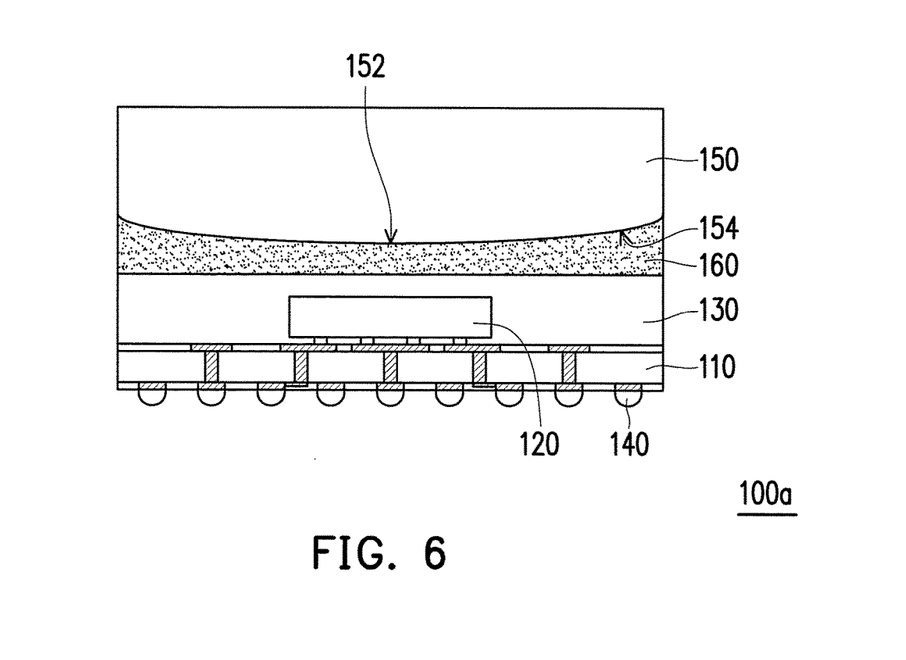
FIG. 6 illustrates a chip package structure according to an embodiment of the present invention.
Figures 7, 8:
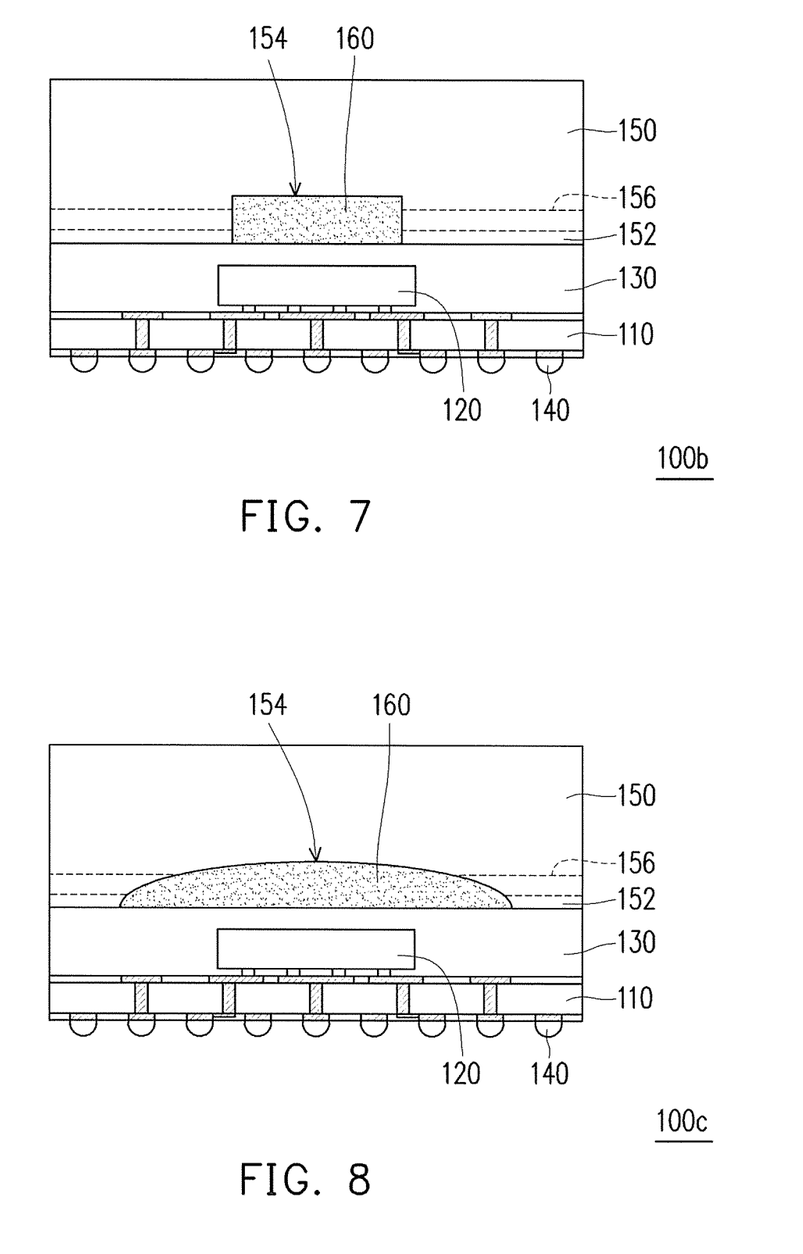
FIG. 7 illustrates a chip package structure according to an embodiment of the present invention.
FIG. 8 illustrates a chip package structure according to an embodiment of the present invention.

FIG. 7 illustrates a chip package structure according to an embodiment of the present invention. FIG. 8 illustrates a chip package structure according to an embodiment of the present invention. It is noted that the chip package structure 100b, 100c shown in FIG. 7 and FIG. 8 contain many features same as or similar to the chip package structures 100, 100a disclosed earlier with FIG. 5 and FIG. 6. For purpose of clarity and simplicity, detail description of same or similar features may be omitted, and the same or similar reference numbers denote the same or like components. The main differences between the chip package structure 100b, 100c shown in FIG. 7 and FIG. 8 and the chip package structures 100, 100a shown in FIG. 5 and FIG. 6 are described as follows.

In the present embodiment, the chip package 105 may be warped at the peripheral region after the high thermal process of forming the solder balls 140. Namely, the peripheral region of the chip package may be bent away from the solder ball. Accordingly, referring to FIG. 7, in the present embodiment, the convex portion 152 is disposed at the peripheral region surrounding the central region of the patterned metal layer 150, and the concave portion 154 is disposed at the central region of the patterned metal layer 150. The convex portion 152 is in contact with the encapsulant 130 to press the peripheral region of the chip package downward. Therefore, the warpage of the chip package structure 100a is improved. In the embodiment shown in FIG. 8, the concave portion 154 may include a curved surface.

In the present embodiment, the patterned metal layer 150 may further include at least one vent 156. The vent 156 is extended from an inner surface of the concave portion 154 to an outer surface of the patterned metal layer 150. Therefore, the concave portion 154 may communicate with the external environment through the vent 156 to discharge air through the vent 156. Moreover, when the patterned metal layer 150 is pressed onto the adhesion layer 160 to be adhered to the encapsulant 130, a part of the adhesion layer 160 filled in the concave portion 154 may be filled into the vent 156, so as to avoid overflow of the adhesion layer 160. Also, it is noted that the chip package 105 shown in FIG. 2 is adopted in the chip package structure 100a. However, the disclosure is not limited thereto. In the present embodiment, the patterned metal layer 150 may also be adhered to other types of chip packages, e.g. the chip package 105 shown in FIG. 1 and FIG. 3, to reduce the warpage thereof.

Figure 9:
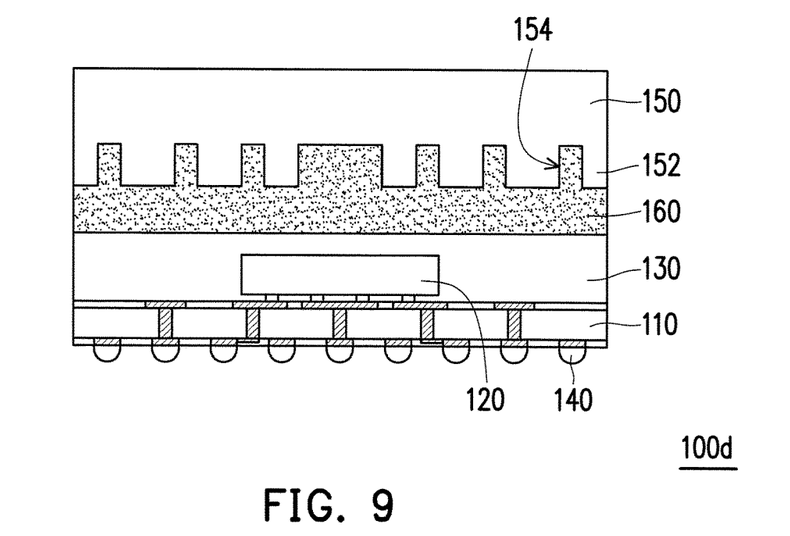
FIG. 9 illustrates a chip package structure according to an embodiment of the present invention.
Figure 10:
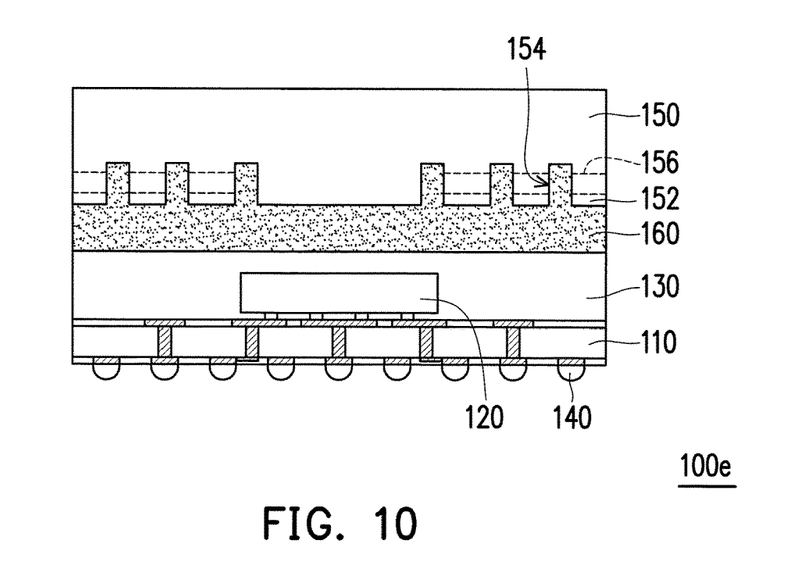
FIG. 10 illustrates a chip package structure according to an embodiment of the present invention.

FIG. 9 illustrates a chip package structure according to an embodiment of the present invention. FIG. 10 illustrates a chip package structure according to an embodiment of the present invention. It is noted that the chip package structure 100d, 100e shown in FIG. 9 and FIG. 10 contain many features same as or similar to the chip package structures 100, 100a disclosed earlier with FIG. 5 and FIG. 6. For purpose of clarity and simplicity, detail description of same or similar features may be omitted, and the same or similar reference numbers denote the same or like components. The main differences between the chip package structure 100d, 100e shown in FIG. 9 and FIG. 10 and the chip package structures 100, 100a shown in FIG. 5 and FIG. 6 are described as follows.

In the present embodiment, the chip package may be warped irregularly with a plurality of convex portions and a plurality of concave portions after the high thermal process of forming the solder balls 140. Accordingly, referring to FIG. 9 and FIG. 10, in the present embodiment, the patterned metal layer 150 may include a plurality of convex portions 152 and a plurality of concave portions 154 defined by the convex portions 152. The position of the convex portions 152 may be corresponding to the convex portions of the warped chip package to press the warped chip package downward. Therefore, the warpage of the chip package structure 100a is improved. In the embodiment shown in FIG. 8, the concave portion 154 may include a curved surface.

Referring to FIG. 10, in the present embodiment, the patterned metal layer 150 may further includes at least one vent 156. The vent 156 is extended from an inner surface of at least one of the concave portions 154 to an outer surface of the patterned metal layer 150. In the present embodiment, the patterned metal layer 150 includes a plurality of vents 156. Each vent 156 is extended from an inner surface of each concave portion 154 to an outer surface of the patterned metal layer 150. Accordingly, the concave portions 154 may communicate with the external environment through the vents 156, so as to discharge air through the vents 156. Moreover, when the patterned metal layer 150 is pressed onto the adhesion layer 160 to be adhered to the encapsulant 130, a part of the adhesion layer 160 filled in the concave portions 154 may be filled into the vents 156, so as to avoid overflow of the adhesion layer 160. Also, it is noted that the chip package 105 shown in FIG. 2 is adopted in the chip package structures 100d, 100e. However, the disclosure is not limited thereto. In the present embodiment, the patterned metal layer 150 may also be adhered to other types of chip packages, e.g. the chip package 105 shown in FIG. 1 and FIG. 3, to reduce the warpage thereof. In an alternative embodiment, at least a part of the convex portions 152 in FIG. 9 and FIG. 10 may be in contact with the encapsulant 130.

In sum, in the chip package structure and the manufacturing method thereof, a chip package may be warped after the high thermal process of forming solder balls. Accordingly, in the present disclosure, a patterned metal layer including at least one convex is adhered to a chip package by an adhesion layer. The position of the convex portion of the patterned metal layer is corresponding to the warpage of the chip package so as to press the warpage downward. Therefore, the warpage of the chip package structure is improved and the reliability of the chip package structure is enhanced.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A chip package structure, comprising:
 a substrate, comprising a first surface and a second surface opposite to each other;
 a chip, disposed on the first surface and electrically connected to the substrate;
 an encapsulant encapsulating the chip and covering the first surface;
 a patterned metal layer disposed on the encapsulant, wherein the patterned metal layer comprises at least one convex portion bulged toward the encapsulant, at least one concave portion defined by the convex portion, and at least one vent extended from an inner surface of the at least one concave portion to an outer surface of the patterned metal layer; and
 an adhesion layer filling a gap between the patterned metal layer and the encapsulant.
2. The chip package structure as claimed in claim 1, further comprising a plurality of solder balls disposed on the second surface and electrically connected to the substrate.
3. The chip package structure as claimed in claim 2, wherein the substrate comprises a redistribution layer electrically connecting the chip and the solder balls.
4. The chip package structure as claimed in claim 1, wherein the substrate comprises a plurality of patterned circuit layers disposed on the first surface and the second surface and a plurality of through vias penetrating the substrate and electrically connecting the patterned circuit layers.
5. The chip package structure as claimed in claim 1, wherein the chip is mounted on the substrate by a flip-chip bonding or a wire-bonding technique.

6. The chip package structure as claimed in claim 1, wherein the adhesion layer fills the concave portion.

7. The chip package structure as claimed in claim 6, wherein the convex portion is disposed at a central region of the patterned metal layer and in contact with the encapsulant, and the concave portion surrounds the central region.

8. The chip package structure as claimed in claim 6, wherein the concave portion is disposed at a central region of the patterned metal layer, and the convex portion is disposed at a peripheral region surrounding the central region of the patterned metal layer and in contact with the encapsulant.

9. The chip package structure as claimed in claim 1, wherein the adhesion layer filled in the concave portion is filled into a part of the vent.

10. The chip package structure as claimed in claim 6, wherein the convex portion and/or the concave portion comprises a curved surface.

11. The chip package as claimed in claim 6, wherein the number of the at least one concave portion is plural and the number of the at least one convex portion is plural.

12. A manufacturing method of a chip package structure, comprising:
    disposing a chip on a first surface of a substrate, wherein the chip is electrically connected to the substrate;
    forming an encapsulant to encapsulate the chip and cover the first surface;
    forming a patterned metal layer, wherein the patterned metal layer comprises at least one convex portion bulged toward the encapsulant, at least one concave portion defined by the convex portion, and at least one vent extended from an inner surface of the at least one concave portion to an outer surface of the patterned metal layer; and
    adhering the patterned metal layer onto the encapsulant by an adhesion layer, wherein the convex portion faces and is bulged toward the encapsulant, and the adhesion layer fills a gap between the patterned metal layer and the encapsulant.

13. The manufacturing method of the chip package structure as claimed in claim 12, further comprising:
    forming a plurality of solder balls on a second surface of the substrate, wherein the second surface is opposite to the first surface and the solder balls are electrically connected to the substrate.

14. The manufacturing method of the chip package structure as claimed in claim 13, wherein the substrate comprises a redistribution layer electrically connecting the chip and the solder balls.

15. The manufacturing method of the chip package structure as claimed in claim 12, wherein the substrate comprises a plurality of patterned circuit layers disposed on the first surface and a second surface opposite to the first surface and a plurality of through vias penetrating the substrate and electrically connecting the patterned circuit layers.

16. The manufacturing method of the chip package structure as claimed in claim 12, wherein the chip is mounted on the substrate by a flip-chip bonding or a wire bonding technique.

17. The manufacturing method of the chip package structure as claimed in claim 12, wherein the patterned metal layer is formed by an electroplating process.

18. The manufacturing method of the chip package structure as claimed in claim 12, wherein the adhesion layer fills the concave portion.

19. The manufacturing method of the chip package structure as claimed in claim 18, wherein the concave portion is formed by an etching process.

* * * * *